(12) United States Patent
Jung et al.

(10) Patent No.: US 10,438,721 B2
(45) Date of Patent: Oct. 8, 2019

(54) SHAPED FILLER FOR CABLE AND SUBMARINE CABLE HAVING THE SAME

(71) Applicant: LS CABLE & SYSTEM LTD., Anyang-si, Gyeonggi-do (KR)

(72) Inventors: Soon Chul Jung, Uijeongbu-si (KR); Kum Hwan Cha, Anyang-si (KR); Kyoung Soo Kim, Bucheon-si (KR); Doo Yeon Kim, Suwon-si (KR); Seung Chol Lee, Gunpo-si (KR)

(73) Assignee: LS CABLE & SYSTEM LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/025,053

(22) Filed: Jul. 2, 2018

(65) Prior Publication Data
US 2019/0013112 A1 Jan. 10, 2019

(30) Foreign Application Priority Data
Jul. 7, 2017 (KR) .......................... 10-2017-0086543

(51) Int. Cl.
*H01B 7/14* (2006.01)
*G02B 6/44* (2006.01)
*H05K 9/00* (2006.01)
*H01B 9/00* (2006.01)
*H01B 7/24* (2006.01)
(Continued)

(52) U.S. Cl.
CPC ............ *H01B 7/14* (2013.01); *G02B 6/4427* (2013.01); *G02B 6/4432* (2013.01); *G02B 6/4478* (2013.01); *H01B 7/24* (2013.01); *H01B 9/005* (2013.01); *H01B 9/027* (2013.01); *H05K 9/0098* (2013.01); *H01B 7/1895* (2013.01)

(58) Field of Classification Search
None
See application file for complete search history.

(56) References Cited

U.S. PATENT DOCUMENTS 4,673,247 A * 6/1987 Oestreich ................. C08K 3/22
174/70 R
6,035,087 A * 3/2000 Bonicel .................. G02B 6/441
385/109
(Continued)

FOREIGN PATENT DOCUMENTS

| CN | 105683798 A | 6/2016 | |
|---|---|---|---|
| WO | 2017043780 A1 | 3/2017 | |
| WO | WO2017/043780 | * 3/2017 | ............... H01B 7/24 |

OTHER PUBLICATIONS

Chinese Office Action for related Chinese Application No. 201810620208.1; action dated Jul. 3, 2019; (6 pages).

*Primary Examiner* — Dimary S Lopez Cruz
*Assistant Examiner* — Muhammed Azam
(74) *Attorney, Agent, or Firm* — K&L Gates LLP (57) ABSTRACT

A shaped filler for accommodating and protecting the optical unit for a submarine cable (hybrid cable), which maintains a round shape of a whole cable with a plurality of core parts each having a round cross section, comprises: an optical-unit accommodation part configured to accommodate an optical unit in a direction toward a central art of the cable; a central chamber behind the optical-unit accommodation part; at least one side chamber provided between the optical-unit accommodation part and the central chamber to be symmetrical to each other.

15 Claims, 4 Drawing Sheets

(51) Int. Cl.
*H01B 9/02* (2006.01)
*H01B 7/18* (2006.01)

(56) References Cited

U.S. PATENT DOCUMENTS

| | | | | |
|---|---|---|---|---|
| 6,046,404 A * | 4/2000 | Figenschou | ............ | E21B 17/01 138/111 |
| 6,249,628 B1 * | 6/2001 | Rutterman | ........... | G02B 6/4495 385/100 |
| 6,249,629 B1 * | 6/2001 | Bringuier | ........... | G02B 6/4433 385/101 |
| 6,424,769 B1 * | 7/2002 | Olsson | ................. | G02B 6/4479 385/102 |
| 6,612,370 B1 * | 9/2003 | Jahnsen | ................. | E21B 17/01 166/367 |
| 6,940,054 B1 * | 9/2005 | Heggdal | ................... | F16L 9/19 219/629 |
| 7,239,781 B2 * | 7/2007 | Chartier | ............... | G02B 6/4416 174/24 |
| 7,473,844 B2 * | 1/2009 | Figenschou | ........... | E21B 17/203 174/110 R |
| 8,723,030 B2 * | 5/2014 | Figenschou | ............. | F16L 53/37 174/47 |
| 8,921,692 B2 * | 12/2014 | Nelson | ................... | E21B 17/01 174/128.1 |
| 9,010,439 B2 * | 4/2015 | Fogg | ..................... | H01B 7/045 166/344 |
| 10,262,772 B2 * | 4/2019 | Kim | ....................... | H01B 7/14 |
| 2005/0201696 A1 * | 9/2005 | Fee | ........................ | G02B 6/441 385/101 |
| 2006/0127014 A1 * | 6/2006 | Ledbetter | ............. | G02B 6/4494 385/109 |
| 2007/0205009 A1 * | 9/2007 | Figenschou | ........... | F16L 11/127 174/47 |
| 2010/0012342 A1 * | 1/2010 | Figenschou | ........... | F16L 11/088 174/47 |
| 2010/0054677 A1 * | 3/2010 | Figenschou | ........... | H01B 7/045 385/101 |
| 2011/0005795 A1 * | 1/2011 | Deighton | ............... | H01B 7/045 174/47 |
| 2012/0061123 A1 * | 3/2012 | Deighton | ............... | H01B 7/045 174/128.1 |
| 2012/0234596 A1 * | 9/2012 | Lund | ...................... | H01B 7/045 174/70 R |
| 2012/0241040 A1 * | 9/2012 | Fogg | ..................... | H01B 7/046 138/172 |
| 2013/0220660 A1 * | 8/2013 | Wong | .................... | H01B 7/046 174/37 |
| 2015/0041171 A1 * | 2/2015 | Heggdal | ................ | H01B 7/045 174/15.6 |
| 2015/0144374 A1 * | 5/2015 | Whiddon | ............. | E21B 33/0355 174/113 R |
| 2018/0268961 A1 * | 9/2018 | Kim | ....................... | H01B 13/22 |

\* cited by examiner

SHAPED FILLER FOR CABLE AND SUBMARINE CABLE HAVING THE SAME

CROSS-REFERENCE TO RELATED APPLICATIONS

Pursuant to 35 U.S.C. § 119(a), this application claims the benefit of earlier filing date and right of priority to Korean Application No. 10-2017-0086543, filed on Jul. 7, 2017 in the Korean Intellectual Property Office, the disclosure of which is incorporated herein by reference in its entirety.

BACKGROUND OF THE INVENTION

Field of the Invention

The present invention relates to a shaped filler for a cable and a submarine cable having the same.

Background Art

In a submarine cable with a plurality of power line units each including a conductor and configured to transmit power (hereinafter referred to as 'core parts') and an optical unit including optical fiber, the plurality of core parts are arranged at a central part of the submarine cable to be roughly symmetric to each other and a protective layer is provided along outer sides of the plurality of core parts.

However, since the submarine cable includes the plurality of core parts, the roundness of the submarine cable may be difficult to maintain. Particularly, an external force such as external pressure is applied to the submarine cable from the outside when the submarine cable is installed or is wound around a turntable to install the submarine cable at the bottom of a sea, and thus the core parts included therein may be damaged. Accordingly, a shaped filler for a cable is needed to maintain the roundness of the submarine cable and protect the core parts included in the submarine cable when an external force such as external pressure is applied during the installation of the submarine cable.

Recently, there is a growing need for an optical communication system based on optical cable including optical fiber having higher bandwidth characteristics than those of an existing copper communication line. Thus, generally, a power cable for transmission of power is manufactured in a hybrid cable form with an optical unit having optical fiber to transmit both power and information.

When compared to the existing copper communication line, a submarine cable including an optical unit is a transmission medium which is advantageous in terms of transmission characteristics such as low loss characteristics and a high bandwidth but mechanical reliability is low due to low mechanical strength thereof. Actually, defects (a disconnection, bending, etc.) may occur due to various internal/external causes in conjunction with mechanical weak points of the optical fiber.

Accordingly, a shaped filler for a cable which has not only the above-described functions but also a function of accommodating and protecting the optical unit is needed.

SUMMARY OF THE INVENTION

To address the above-described problems, the present invention is directed to a shaped filler, for a cable, which is capable of maintaining the roundness of a submarine cable having a plurality of core parts.

The present invention is also directed to a shaped filler, for a cable, which is capable of accommodating and protecting an optical unit included in the submarine cable.

The present invention is also directed to a shaped filler, for a cable, which is capable of preventing damage to the core parts and the optical unit included in the submarine cable when the submarine cable is installed or when an external force such as external pressure is applied to the submarine cable.

To achieve these objects, the present invention may provide a shaped filler, for a cable, which maintains a round shape of a whole cable with a plurality of core parts each having a round cross section, the shaped filler comprising: an optical-unit accommodation part configured to accommodate an optical unit in a direction toward a central part of the cable; a central chamber behind the optical-unit accommodation part; at least one side chamber provided between the optical-unit accommodation part and the central chamber to be symmetrical to each other.

And an outer surface of the shaped filler may be in a shape having one circular arc, and an inner surface thereof is in a shape having two circular arcs.

And the optical-unit accommodation part may be in a round shape, be cut to be open toward a center of the cable, and may have an internal diameter greater than a size of the optical unit accommodated in the optical-unit accommodation part.

And the central chamber may be in a rectangular shape and may have a width corresponding to an internal diameter of the optical-unit accommodation part.

And support parts dividing the central chamber may be arranged parallel in a widthwise direction and a thicknesswise direction.

And each of the at least one side chamber may be divided into plural pieces.

And support parts dividing the at least one side chamber into plural pieces may comprise at least one support part arranged in parallel in a widthwise direction; and at least one support part arranged perpendicular to a thickness direction.

And to achieve these objects, the present invention provides a shaped filler for a cable, comprise a frame part including an outer frame part having a circular arc shape and a pair of inner frame parts; an optical-unit accommodation part frame forming an optical-unit accommodation part on an inner side of the frame part to accommodate an optical unit; and a support part connecting the outer frame part and the pair of inner frame parts.

And the support part may comprise at least one transverse support part arranged in a widthwise direction.

And the support part may comprise a pair of longitudinal support parts arranged at opposite sides of the optical-unit accommodation part in a thicknesswise direction.

And the transverse support part may connect the pair of longitudinal support parts to each other.

And the shaped filler may further comprise a central chamber arranged in a direction toward an external diameter of the cable from the optical-unit accommodation part.

And the central chamber may be provided between the pairs of longitudinal support parts which are adjacent to each other.

And the central chamber may be provided between the pair of longitudinal support parts connecting the outer frame part and the optical-unit accommodation part frame to each other.

And the shaped filler may further comprise a cut part configured to selectively open the optical-unit accommodation part.

And the cut part may be formed at the frame part while facing a central part of the cable.

And the pairs of longitudinal support parts may be in a linear shape.

And to achieve these objects, the present invention may provide a submarine cable comprising a plurality of core parts each including a conductor, an inner semiconducting layer, an insulating layer, an outer semiconducting layer, a metal shielding layer, and a polymer sheath; a protective layer surrounding the plurality of core parts; and the shaped filler, for a cable, according to any one of claims 1 to 17, the shape filler being provided between the plurality of core parts and the protective layer.

DETAILED DESCRIPTION

Hereinafter, exemplary embodiments of the present invention will be described in detail with reference to the accompanying drawings. The present invention is, however, not limited thereto and may be embodied in many different forms. Rather, the embodiments set forth herein are provided so that this disclosure will be thorough and complete, and fully convey the scope of the invention to those skilled in the art. Throughout the specification, the same reference numbers represent the same elements.

First, a structure of a submarine cable having an optical unit will be described and then a shaped filler for a cable according to the present invention will be described.

Figure 1:
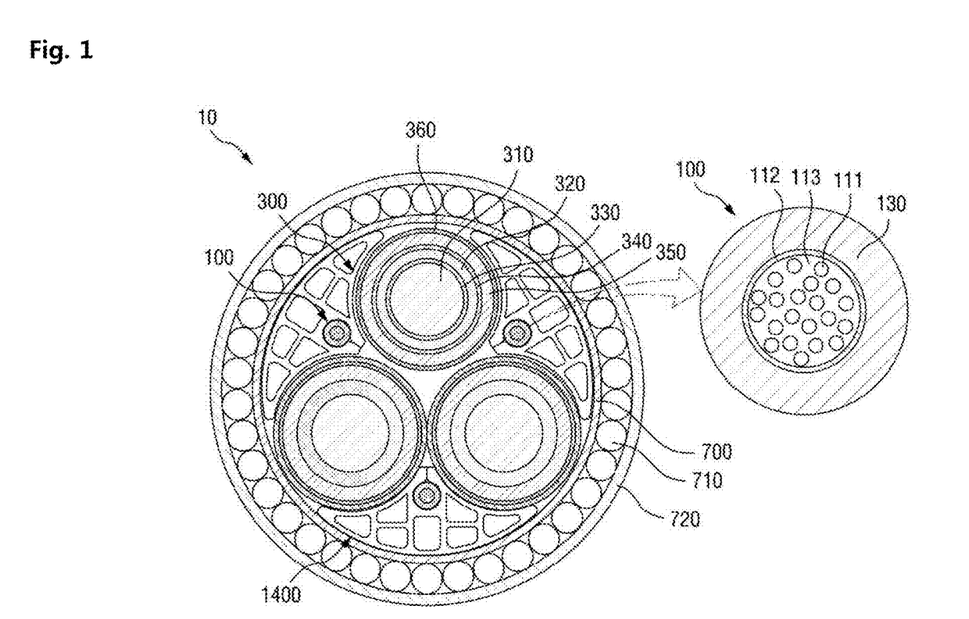
FIG. 1 is a cross-sectional view of a submarine cable according to an embodiment of the present invention.

FIG. 1 is a cross-sectional view of a submarine cable 10 having optical units 100, according to an embodiment of the present invention.

Although FIG. 1 illustrates that the submarine cable 10 is a three-phase cable having three core parts 300, the present invention is not limited thereto and is applicable to all submarine cables having a plurality of core parts.

Each of the core parts 300 includes a conductor 310, an inner semiconducting layer 330, an insulating layer 320, an outer semiconducting layer 340, a metal shielding layer 350, and a polymer sheath 360.

The conductor 310 may function as a path through which current flows to transmit power, and may be formed of a material, e.g., copper or aluminum, having high conductivity to minimize power loss and having strength and flexibility appropriate to manufacture a cable and to be available as a material of the cable.

The conductor 310 may be a round compressed conductor manufactured by twisting a plurality of round wires and compressing the round wires into a round shape, or may be a flat conductor which includes a round central wire and a flat wire layer having flat wires twisted to surround the round central wire and which has an overall round cross section. The flat conductor has a higher space factor than that of the compressed round conductor and thus may contribute to decreasing an external diameter of a cable.

However, since the conductor 310 has a non-flat surface, an electric field may not be uniform and a partial corona discharge is likely to occur. Furthermore, the insulating performance of the conductor 310 may be decreased when a gap occurs between a surface of the conductor 310 and the insulating layer 320 which will be described in detail below.

To solve the above-described problems, the inner semiconducting layer 330 may be formed at an outer side of the conductor 310. The inner semiconducting layer 330 may be formed by adding conductive particles, such as carbon black, carbon nanotubes, carbon nanoplates, or graphite, to an insulating material and may thus have a semiconducting property.

The inner semiconducting layer 330 prevents a sharp change in an electric field between the conductor 310 and the insulating layer 320 which will be described in detail below, thereby stabilizing insulating performance. Furthermore, the inner semiconducting layer 330 may suppress a non-uniform charge distribution on a surface of the conductor 310 to uniformize an electric field, and prevent the formation of a gap between the conductor 310 and the insulating layer 320, thereby suppressing the occurrence of a corona discharge, a dielectric breakdown, etc.

The insulating layer 320 is provided on an outer side of the inner semiconducting layer 330 to electrically insulate the inner semiconducting layer 330 from the outside, so that electric current may not leak to the outside via the conductor 310. Generally, the insulating layer 320 should have a high breakdown voltage and insulating performance thereof should be stably maintained for a long time period. Furthermore, the insulating layer 320 should have a low dielectric loss rate and heat resistance performance, e.g., a heat resistance property. Accordingly, the insulating layer 320 may be formed of polyolefin resin such as polyethylene and polypropylene, and preferably, polyethylene resin. Here, the polyethylene resin may be cross-linked resin.

The outer semiconducting layer 340 may be provided on an outer side of the insulating layer 320. The outer semiconducting layer 340 is formed of a semiconducting material obtained by adding conductive particles, e.g., carbon black, carbon nanotubes, carbon nanoplates, or graphite, to an insulating material, similar to the inner semiconducting layer 330, and thus may suppress a non-uniform charge distribution between the insulating layer 320 and the metal shielding layer 350, thereby stabilizing insulating performance. In addition, the outer semiconducting layer 340 may planarize a surface of the insulating layer 320 to lessen the concentration of an electric field in the submarine cable 10, thereby preventing the occurrence of a corona discharge, and may physically protect the insulating layer 320.

Each of the core parts 300 may additionally include a moisture absorbing part (not shown) to prevent the permeation of moisture into the submarine cable 10. The moisture absorbing part may be formed between the wires of the conductor 310 and/or on the outer side of the conductor 310. The moisture absorbing part may be in the form of powder, a tape, a coating layer, or a film containing a super-absorbent polymer (SAP) which quickly absorbs moisture permeating the submarine cable 10 and is more capable of maintaining a state of absorbing the moisture, and may prevent the permeation of moisture in a lengthwise direction of the submarine cable 10. The moisture absorbing part may have a semiconducting property to prevent a sharp change in an electric field.

The metal shielding layer 350 and the polymeric sheath 360 may be additionally provided outside the outer semiconducting layer 340. The metal shielding layer 350 and the polymeric sheath 360 may protect the core parts 300 of the submarine cable 10 from various environmental factors, e.g., the permeation of moisture, mechanical trauma, abrasion, etc., and fault current which may affect the power transmission performance of the submarine cable 10.

The metal shielding layer 350 may be grounded at an end part of the submarine cable 10, function as a path through which fault current flows when an accident such as a ground fault or a short circuit occurs, protect the submarine cable 10 from external impacts, and block an electric field from being discharged to the outside of the submarine cable 10.

In the case of the submarine cable 10 installed in an environment such as the bottom of a sea, the metal shielding layer 350 may be formed to seal the core part 300 to prevent a decrease in insulating performance, caused by the invasion of foreign substances such as moisture. For example, the metal shielding layer 350 may be formed to have seamless and consecutive outer surfaces by extruding a metal fused on the outer sides of the core parts 300, thereby improving cut-off performance. The metal may be lead or aluminum. In particular, in the case of a submarine cable, lead having high corrosion resistance to sea water is preferably used, and a metal element-added lead alloy is more preferably used to supplement a mechanical property.

The polymeric sheath 360 formed of resin such as polyvinyl chloride (PVC) or polyethylene may be provided on an outer side of the metal shielding layer 350 to improve the corrosion resistance, cut-off performance, etc. of the submarine cable 10 and protect the submarine cable 10 from mechanical trauma and other external and environmental factors such as heat, ultraviolet light, etc. In particular, polyethylene resin having high cut-off performance is preferably used in the case of a submarine cable, and polyvinyl chloride resin is preferably used in an environment requiring frame resistance.

The core part 300 may further include a woven copper wire tape (not shown) and a moisture absorbing layer (not shown) between the metal shielding layer 350 and the outer semiconducting layer 340. The woven copper wire tape may include copper wires, a non-woven fabric tape or the like, and be configured to facilitate an electrical contact between the outer semiconducting layer 340 and the metal shielding layer 350. The moisture absorbing layer may be in the form of powder, a tape, a coating layer, a film, or the like containing SAP which quickly absorbs moisture permeating the submarine cable 10 and is capable of maintaining a state of absorbing the moisture. Thus, the moisture absorbing layer may prevent the permeation of moisture in the lengthwise direction of the multi submarine cable 10. To prevent a sharp change in an electric field in the moisture absorbing layer, copper wires may be included in the moisture absorbing layer.

The submarine cable 10 may further include the optical units 100.

Here, each of the optical units 100 may include at least one optical fiber 111 and a tube 112 accommodating the at least one optical fiber 111.

Each of the optical units 100 includes a certain number of optical fibers 111 mounted in the tube 112, together with a filler 113. The tube 112 may be formed of a material having hardness, such as stainless steel. Each of the optical units 100 may further include a sheath 130 covering the tube 112.

Although FIG. 1 illustrates an example in which a single protective tube is included in a single sheath, embodiments are not limited thereto, and for example, a plurality of protective tubes may be included in one sheath and at least one optical fiber may be included in each of the protective tubes. In this case, an external sheath may be provided after all the at least one optical fiber and the protective tubes are connected to each other.

Since the submarine cable 10 is installed across the bottom of, for example, a sea, the submarine cable 10 may further include various types of protective layers to protect the inner components thereof even in a harsh environment such as sea water of salt of the sea. For example, as illustrated in FIG. 1, the submarine cable 10 may include a bedding layer 700 covering the core parts 300 and the optical units 100 and formed of polypropylene (PP) yarn or the like, armoring iron wires 710 provided at an outer side of the bedding layer 700 to improve mechanical strength the bedding layer 700, and a jacket 720 provided at outer sides of the armoring iron wires 710.

An existing submarine cable may include a filler between the core parts 300, the optical units 100, and the bedding layer 700 to protect the core parts 300 and the optical units 100.

Generally, polypropylene yarn is used as the above-described filler. However, if a large number of such yarns are included in a submarine cable, when the submarine cable is manufactured by combining the core parts 300, the optical units 100, and the yarns, the yarns may be caught by equipment used to combine the core parts 300, the optical units 100, and the yarns at predetermined pitches.

To solve this problem, the combining of the core parts 300, the optical units 100, and the yarns is performed by decreasing the number of yarns to be inserted into the submarine cable but a region of the submarine cable may be distorted due to pressure applied during formation of protective layers such as the armoring iron wires 710 and the jacket 720 and thus a whole cross section of the submarine cable may not be round.

As described above, when the cross section of the submarine cable is not round, load of the submarine cable wound along a turntable after the manufacture of the cable is not uniformly dispersed. Thus, the submarine cable is likely to be broken during storage or transfer thereof, and a tensile force is not uniformly applied to a cross section of the whole submarine cable when the submarine cable is bent during the installation thereof. Such a phenomenon will be a factor causing damage to a portion of the submarine cable to which a higher tensile force is applied when the submarine cable is used for a long period time. Furthermore, in the case of a submarine cable having the optical units 100, the optical units 100 are likely to be damaged when an external force is applied to the submarine cable.

Accordingly, a shaped filler 1400 for a cable is provided to maintain the roundness of the submarine cable 10 and to prevent the core parts 300 and the optical units 100 of the submarine cable 10 from being damaged or broken by uniformly dispersing bending stress, installation tension, or a tensile force applied to the submarine cable 10 the during installation of the submarine cable 10.

The shaped filler 1400 for a cable is provided between so-called protective layers, such as the bedding layer 700, the armoring iron wires 710 and the jacket 720, and the core parts 300 to protect the core parts 300. In particular, the shaped filler 1400 for a cable accommodates the optical unit 100 to protect the optical unit 100 when an external force is applied to the submarine cable 10, for example, during the installation of the submarine cable 10.

The submarine cable 10 may be completed by combining the core parts 300, the shaped filler 1400 for a cable, and the optical units 100 of the submarine cable 10 at the predetermined pitches by a device configured to combine the core parts 300, the shaped filler 1400, and the optical units 100 and then performing coating on a resultant structure. In this case, the combining of the core parts 300, the shaped filler 1400, and the optical units 100 may be performed by the device by inserting the optical unit 100 into an optical-unit accommodation part a of the shaped filler 1400 for a cable which will be described below.

A structure of such a shaped filler for a cable will be described in detail below.

Figure 2:
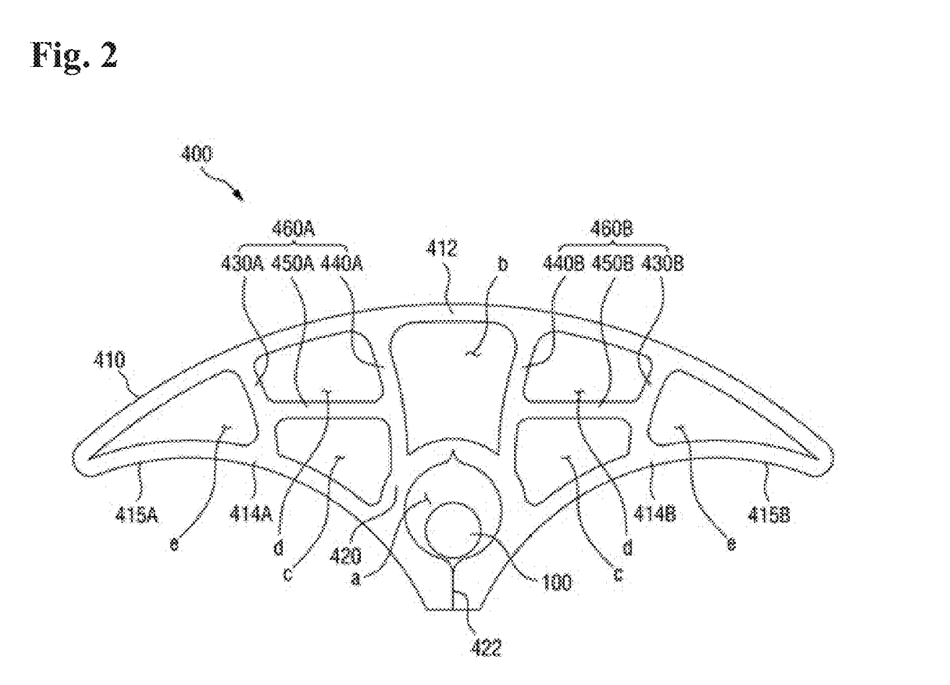
FIG. 2 is a cross-sectional view of a shaped filler for a cable, according to an embodiment of the present invention.

FIG. 2 is a cross-sectional view of a shaped filler 400 for a cable, according to an embodiment of the present invention.

Referring to FIG. 2, the shaped filler 400 for a cable according to an embodiment of the present invention may be provided to maintain a round shape of a whole cable including a plurality of core parts each having a round cross section. The cable shaped filler 400 may include an optical-unit accommodation part a for accommodating an optical unit in a direction toward a center of a cable, a central chamber b behind the optical-unit accommodation part a, and at least one side chamber, e.g., side chambers c, d, and e, provided to be symmetrical to each other while having the optical-unit accommodation part a and the central chamber b therebetween.

An outer surface of the shaped filler 400 for a cable is provided in a shape having one circular arc and an inner surface thereof is provided in a shape having two circular arcs.

The inner surface of the shaped filler 400 for a cable is provided in the shape having two circular arcs to place the shaped filler 400 for a cable in a space between core parts as illustrated in FIG. 1. The two circular arcs of the inner surface of the shaped filler 400 for a cable may have a degree of curvature corresponding to a cylindrical surface of the core parts. The circular arc of the outer surface of the shaped filler 400 for a cable may have a degree of curvature appropriate to maintain a round shape of a cross section of a whole cable when a plurality of core parts are twisted together.

As illustrated in FIG. 2, the optical-unit accommodation part a may be formed in a round shape and be cut to be open in a direction toward a center of a cable, and an internal diameter of the optical-unit accommodation part a may be greater than a size of an optical unit 100 accommodated in the optical-unit accommodation part a.

The central chamber b behind the optical-unit accommodation part a may be in a rectangular shape and have a width corresponding the internal diameter of the optical-unit accommodation part a.

Each of the side chambers c, d, and e provided to be symmetrical to one another while having the optical-unit accommodation part a and the central chamber b therebetween may be divided into several pieces. The number and size of the side chambers c, d, and e may be variously changed according to the total size of the shaped filler 400 for a cable and a thickness or a material of a frame part or a support part which forms a cross section of the shaped filler 400 for a cable and which will be described below.

While the cross section of the shaped filler 400 for a cable has been described above in terms of either spaces divided therefrom or chambers, the cross section of the shaped filler 400 for a cable will be described below in terms of the frame part or the support part forming the cross section of the shaped filler 400 for a cable.

The shaped filler 400 for a cable may include a frame part 410 including a circular arc shaped outer frame part 412 and a pair of inner frame parts 414A and 414B, an optical-unit accommodation part frame 420 forming the optical-unit accommodation part a at an inner side of the frame part 410 to accommodate the optical unit 100, and support parts 460A and 460B connecting the outer frame part 412 and the inner frame parts 414A and 414B.

In detail, the frame part 410 includes the outer frame part 412 having a circular arc shape and formed along a predetermined radius to maintain the roundness of the above-described submarine cable 10, and the pair of inner frame parts 414A and 414B respectively having core-part accommodation parts 415A and 415B for accommodating at least portions of an outer circumference of the core part 300.

The outer frame part 412 may be designed to have a circular arc shape corresponding to the predetermined radius so as to maintain the roundness of the submarine cable 10. Opposite end parts of the outer frame part 412 may be respectively connected to the first inner frame part 414A and the second inner frame part 414B.

In the submarine cable 10, the inner frame parts 414A and 414B are formed facing the core part 300 and respectively include the core-part accommodation parts 415A and 415B which are in contact with at least portions of the outer circumference of the core part 300.

In this case, the inner frame parts 414A and 414B may include the first inner frame part 414A and the second inner frame part 414B. The first inner frame part 414A and the second inner frame part 414B may respectively include the first core-part accommodation part 415A and the second core-part accommodation part 415B for accommodating at least portions of the outer circumference of one of the core parts 300.

For example, the core-part accommodation parts 415A and 415B may be designed to have a shape corresponding to an external diameter of the core part 300, so that an external force applied to the submarine cable 10 may not be concentrated on a portion of the core part 300 but may be uniformly dispersed.

The submarine cable 10 may be a hybrid optical and electrical cable including the optical unit 100. In this case, the shaped filler 400 for a cable may include the optical-unit accommodation part frame 420, and the optical-unit accommodation part a provided at the inner side of the optical-unit accommodation part frame 420, and the optical unit 100 may be accommodated in the optical-unit accommodation part a.

The optical-unit accommodation part a is located at a center of the inner side of the frame part 410.

In this case, the shaped filler 400 may include a cut part 422 for selectively opening the optical-unit accommodation part a. The cut part 422 may be formed at the frame part 410 to face a central part of the submarine cable 10. More particularly, the cut part 422 is formed between the first inner frame parts 414A and the second inner frame parts 414B described above.

That is, the first inner frame parts 414A and the second inner frame parts 414B may be separated along the cut part 422. In this case, the optical-unit accommodation part a is open such that the optical unit 100 may be accommodated inside the optical-unit accommodation part a.

The above-described device configured to combine the core parts 300, the shaped filler 1400, and the optical units 100 may accommodate the optical unit 100 in the optical-unit accommodation part a by opening the cut part 422 by separating the first inner frame parts 414A and the second inner frame parts 414B along the cut part 422.

In this case, the frame part 410 may be formed of synthetic resin having a certain degree of elasticity. Accordingly, a rotation unit need not be additionally provided to when the cut part 422 is opened by separating end parts of the first inner frame parts 414A and the second inner frame parts 414B.

The cut part 422 is closed and thus the optical-unit accommodation part a is kept closed, except when the optical unit 100 is inserted into the optical-unit accommodation part a.

The optical-unit accommodation part a may be in a round shape to conveniently accommodate the optical unit 100. As described above, when the optical-unit accommodation part a is in the round shape, the optical-unit accommodation part a has a diameter greater than or equal to an external diameter of the optical unit 100 and thus the optical unit 100 may be prevented from being damaged by the optical-unit accommodation part frame 420. Here, the round shape is merely an example, and the shape of the optical-unit accommodation part a may be variously changed. In this case, a short axis of the optical-unit accommodation part a may be greater than or equal to the external diameter of the optical unit 100.

The shaped filler 400 for a cable according to an embodiment of the present invention includes the support parts 460A and 460B to connect the outer frame part 412 and the inner frame parts 415A and 415B or the optical-unit accommodation part frame 420. In this case, the support parts 460A and 460B may include at least one support part, e.g., transverse support parts 450A and 450B, arranged in a horizontal direction, i.e., a widthwise direction, of the shaped filler 400.

The support parts 460A and 460B may reinforce the strength of the frame part 410, and disperse an external force, which is to be applied to the outer frame part 412, to other portions of the shaped filler 400 for a cable. That is, the support parts 460A and 460B may be used as support ribs or the like.

The support parts 460A and 460B may further include a pair of longitudinal support parts 430A and 430B and a pair of longitudinal support parts 440A and 440B arranged at opposite sides of the optical-unit accommodation part a in a vertical direction, i.e., a thicknesswise direction, the shaped filler 400.

Here, the terms "vertical direction" or "perpendicular" should be understood to mean a thicknesswise direction of a shaped filler when referred to FIG. 2 or FIG. 4 which will be described below. The terms "vertical direction" or "perpendicular", when the shaped filler 400 for a cable is included inside the submarine cable 10, may be understood to mean a radial direction with respect to the center of the submarine cable 10.

For example, the first-1 longitudinal support part 430A and the first-2 longitudinal support part 440A may be provided at a left side of the optical-unit accommodation part a, and the second-1 longitudinal support part 430B and the second-2 longitudinal support part 440B may be provided at a right side of the optical-unit accommodation part a.

In this case, the first-1 longitudinal support part 430A connects the outer frame part 412 and the first inner frame parts 414A to each other, and the second-1 longitudinal support part 430B connects the outer frame part 412 and the second inner frame parts 414B to each other.

The first-2 longitudinal support part 440A connects the outer frame part 412 and the optical-unit accommodation part frame 420 to each other. Similarly, the second-2 longitudinal support part 440B connects the outer frame part 412 and the optical-unit accommodation part frame 420 to each other.

In this case, the transverse support parts 450A and 450B connects the pair of longitudinal support parts 430A and 430B and the pair of longitudinal support parts 440A and 440B.

Here, the term "horizontal direction" or "parallel" should be understood to mean a widthwise direction of a shaped filler when referred to FIG. 2 or FIG. 4 which will be described below. The terms "horizontal direction" or "parallel", when the shaped filler 400 for a cable is included inside the submarine cable 10, may be understood to mean a circumferential direction of the submarine cable 10 or a tangential direction of the circumference of the submarine cable 10.

In detail, the first transverse support part 450A connects the first-1 longitudinal support part 430A and the first-2 longitudinal support part 440A to each other. In this case, a side chamber between the first-1 longitudinal support part 430A and the first-2 longitudinal support part 440A may be vertically divided by the first transverse support part 450A.

The second transverse support part 450B connects the second-1 longitudinal support part 430B and the second-2 longitudinal support part 440B. In this case, a side chamber between the second-1 longitudinal support part 430B and the second-2 longitudinal support part 440B may be vertically divided by the second transverse support part 450B.

As described above, bearing power withstanding external pressure applied to the submarine cable 10 may be provided to the submarine cable 10 by separating or dividing the pair of the longitudinal support parts 430A and 430B and the pair of longitudinal support parts 440A and 440B by using the transverse support parts 450A and 450B.

The shaped filler 400 for a cable according to an embodiment of the present invention may further include the central chamber b in a direction toward an external diameter of the submarine cable 10 from the optical-unit accommodation part a.

The central chamber b may be formed between adjacent longitudinal support parts. For example, the central chamber be formed between the first-2 longitudinal support part 440A and the second-2 longitudinal support part 440B which are adjacent to each other.

In this case, both the first-2 longitudinal support part 440A and the second-2 longitudinal support part 440B connect the outer frame part 412 and the optical-unit accommodation part frame 420. Thus, the central chamber b may be considered as being formed between the pair of longitudinal support parts 440A and 440B connecting the outer frame part 412 and the optical-unit accommodation part frame 420 to each other.

The central chamber b minimizes deformation of the optical-unit accommodation part a to protect the optical unit 100 when external pressure or the like is applied to the submarine cable 10, and prevents the shaped filler 400 for a cable from being damaged or broken.

Figure 3:
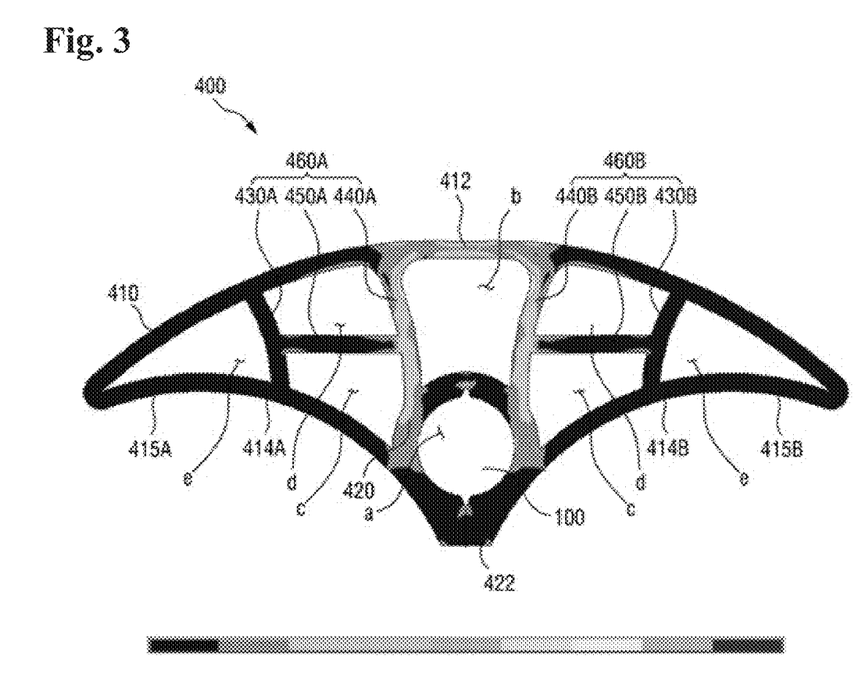
FIG. 3 is a diagram illustrating a distribution of stress when external pressure is applied to the shaped filler, for a cable, illustrated in FIG. 2.

FIG. 3 is a diagram illustrating a distribution of stress when a certain degree of external pressure is applied to the shaped filler 400 for a cable illustrated in FIG. 2.

Referring to FIG. 3, stress is more effectively dispersed to the shaped filler 400 for a cable according to the current embodiment than in a shaped filler for a cable according to the related art, even when external pressure is applied thereto (here, it should be understood that concentration of stress increases in the order of blue to red).

However, as illustrated in FIG. 3, stress was slightly more concentrated at a roughly central part of the shaped filler 400 for a cable, i.e., an inner side of the central chamber b divided by the first-2 longitudinal support part 440A and the second-2 longitudinal support part 440B. A shaped filler, for a cable, according to an embodiment which is capable of preventing the concentration of stress is illustrated in FIG. 4.

Figure 4:
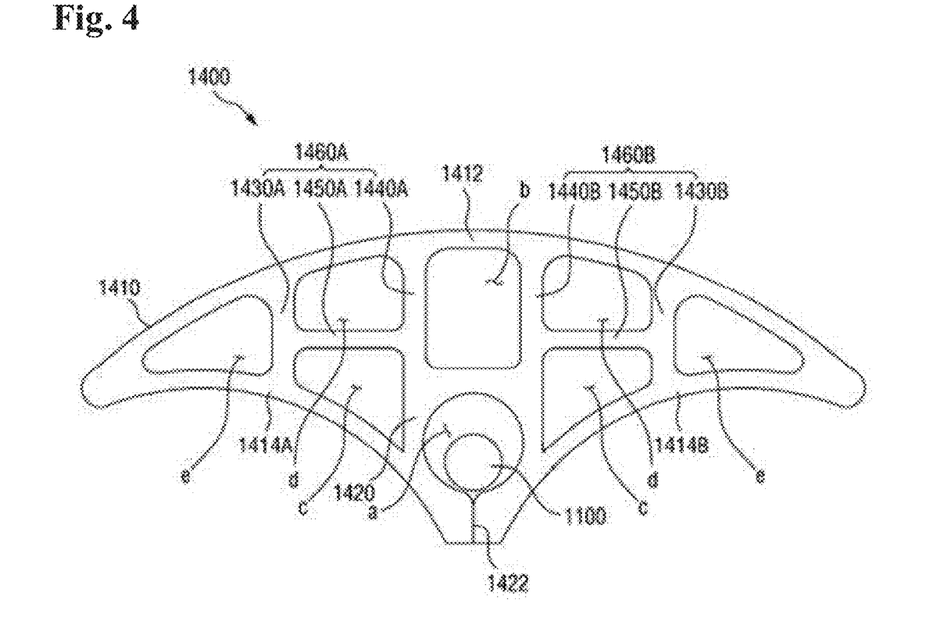
FIG. 4 is a cross-sectional view of a shaped filler for a cable, according to another embodiment of the present invention.

FIG. 4 is a cross-sectional view of a shaped filler 1400 for a cable which is capable of preventing the concentration of stress, according to another embodiment of the present invention.

Support parts dividing a central chamber b may be provided in parallel in a widthwise direction and a thicknesswise direction.

Similarly, support parts dividing side chambers c, d, and e into plural pieces may include at least one support part arranged parallel in the widthwise direction and at least one support part arranged perpendicular to the thicknesswise direction.

Referring to FIG. 4, the shaped filler 1400 for a cable according to the present embodiment may include a frame part 1410 having an outer frame part 1412 and a pair of inner frame parts 1414A and 1414B, an optical fiber unit accommodation part frame 1420 forming an optical fiber unit accommodation part a on the frame part 1410 to accommodate an optical fiber unit 1100, and support parts 1460A and 1460B connecting the outer frame part 1412 and the inner frame parts 1414A and 1414B. The support parts 1460A and 1460B may respectively include at least one transverse support part 1450A and at least one transverse 1450B. The shaped filler 1400 may further include a central chamber b formed in the optical fiber unit accommodation part a in a direction toward the external diameter of the submarine cable 10.

The shaped filler 1400 for a cable according to the current embodiment is different from the shaped filler 400 for a cable of FIG. 3 in that longitudinal support parts 1430A, 1430B, 1440A, and 1440B are in a linear form or are arranged parallel to each other.

That is, in the above-described embodiments of FIGS. 2 and 3, the longitudinal support parts 430A, 430B, 440A, and 440B are provided not in the linear form but in a curved shape. In contrast, in the embodiment of FIG. 4, the longitudinal support part 1430A, 1430B, 1440A, and 1440B are arranged parallel or in a line in the widthwise direction or the thicknesswise direction of the shaped filler 1400.

In this case, when lateral pressure is applied to the shaped filler 1400 for a cable, resistance to the lateral pressure may be more improved than at curved shaped longitudinal support parts (the embodiments of FIG. 2 or 3) and stress may be uniformly dispersed.

As described above, according to the present invention, external pressure applied to the submarine cable 10 may be efficiently dispersed to the shaped fillers 400 and 1400 for a cable, thereby minimizing deformation of the shaped fillers 400 and 1400 for a cable. Accordingly, the roundness of the submarine cable 10 may be maintained, the optical fiber units 100 and 1100 may be protected, and the shaped fillers 400 and 1400 for a cable may be prevented from being damaged or broken.

As described above, according to the present invention, the roundness of a submarine cable having a plurality of core parts may be maintained using a shaped filler, for a cable, provided between the core parts and an external protective layer.

When the submarine cable is a hybrid cable including an optical unit, the shaped filler for a cable may accommodate and protect the optical unit.

Furthermore, the core parts and the optical unit included in the submarine cable may be prevented from being damaged by the shaped filler for a cable when the submarine cable is installed or when an external force such as external pressure is applied to the submarine cable.

While the present invention has been described above with respect to exemplary embodiments thereof, it would be understood by those skilled in the art that various changes and modifications may be made therein without departing from the technical conception and scope of the present invention defined in the following claims. Accordingly, it is clear that all modifications are included in the technical scope of the present invention as long as they include the components as claimed in the claims of the present invention.

What is claimed is:

1. A shaped filler, for a cable, which maintains a round shape of the cable with a plurality of core parts each having a round cross section, the shaped filler comprising:
   an optical-unit accommodation part configured to accommodate an optical unit in a direction toward a central part of the cable;
   a central chamber behind the optical-unit accommodation part; and
   at least one side chamber provided between the optical-unit accommodation part and the central chamber to be symmetrical to each other,
   wherein the optical-unit accommodation part is in a round shape, is cut to be selectively open toward a center of the cable, and has an internal diameter greater than a size of the optical unit accommodated in the optical-unit accommodation part, and
   wherein an optical-unit accommodation part frame between the optical-unit accommodation part and the central chamber is partially cut to be partially open toward the center of the cable.

2. The shaped filler of claim 1, wherein an outer surface of the shaped filler is in a shape having one circular arc, and an inner surface thereof is in a shape having two circular arcs.

3. A submarine cable comprising:
   a plurality of core parts each including a conductor, an inner semiconducting layer, an insulating layer, an outer semiconducting layer, a metal shielding layer, and a polymer sheath;
   a protective layer surrounding the plurality of core parts; and
   the shaped filler, for a cable, according to claim 1, being provided between the plurality of core parts and the protective layer.

4. The shaped filler of claim 1, wherein the central chamber is in a rectangular shape and has a width corresponding to an internal diameter of the optical-unit accommodation part.

5. The shaped filler of claim 4, wherein support parts dividing the central chamber are arranged parallel in a widthwise direction and a thicknesswise direction.

6. The shaped filler of claim 1, wherein each of the at least one side chamber is divided into plural pieces.

7. The shaped filler of claim 6, wherein support parts dividing the at least one side chamber into the plural pieces comprise:
   at least one support part arranged in parallel in a widthwise direction; and
   at least another support part arranged perpendicular to a thickness direction.

8. A shaped filler for a cable, comprising:
   a frame part including an outer frame part having a circular arc shape and a pair of inner frame parts;

an optical-unit accommodation part frame forming an optical-unit accommodation part on an inner side of the frame part to accommodate an optical unit; and
a support part connecting the outer frame part and the pair of inner frame parts,
wherein the optical-unit accommodation part is in a round shape, is cut to be selectively open toward a center of the cable, and has an internal diameter greater than a size of the optical unit accommodated in the optical-unit accommodation part, and
wherein the optical-unit accommodation part frame between the optical-unit accommodation part and a central chamber is partially cut to be partially open toward the center of the cable.

9. The shaped filler of claim 8, wherein the support part comprises at least one transverse support part arranged in a widthwise direction.

10. The shaped filler of claim 9, wherein the support part comprises a pair of longitudinal support parts arranged at opposite sides of the optical-unit accommodation part in a thicknesswise direction.

11. The shaped filler of claim 10, wherein the transverse support part connects the pair of longitudinal support parts to each other.

12. The shaped filler of claim 10, further comprising a central chamber arranged in a direction toward a circumference of the cable from the optical-unit accommodation part.

13. The shaped filler of claim 12, wherein the central chamber is provided between the pair of longitudinal support parts which are adjacent to each other.

14. The shaped filler of claim 12, wherein the central chamber is provided between the pair of longitudinal support parts connecting the outer frame part and the optical-unit accommodation part frame to each other.

15. The shaped filler of claim 10, wherein the pair of longitudinal support parts are in a linear shape.

* * * * *